United States Patent
Kieffel et al.

(10) Patent No.: US 9,491,877 B2
(45) Date of Patent: Nov. 8, 2016

(54) USE OF A MIXTURE COMPRISING A HYDROFLUOROOLEFIN AS A MEDIUM-VOLTAGE ARC-EXTINGUISHING AND/OR INSULATING GAS AND MEDIUM-VOLTAGE ELECTRICAL DEVICE COMPRISING SAME

(75) Inventors: Yannick Kieffel, Saint Jean de Bournay (FR); Alain Girodet, Chassieu (FR); Daniel Piccoz, Lucenay (FR); Romain Maladen, Macon (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 290 days.

(21) Appl. No.: 14/130,786

(22) PCT Filed: Jul. 5, 2012

(86) PCT No.: PCT/EP2012/063180

§ 371 (c)(1),
(2), (4) Date: Jan. 3, 2014

(87) PCT Pub. No.: WO2013/004796

PCT Pub. Date: Jan. 10, 2013

(65) Prior Publication Data

US 2014/0196932 A1 Jul. 17, 2014

(30) Foreign Application Priority Data

Jul. 5, 2011 (FR) .................................. 11 56062

(51) Int. Cl.
*H05K 5/06* (2006.01)
*H01B 3/56* (2006.01)
(Continued)

(52) U.S. Cl.
CPC ................. *H05K 5/06* (2013.01); *B65B 31/00* (2013.01); *H01B 3/56* (2013.01); *H01H 33/56* (2013.01); *H01H 2033/566* (2013.01)

(58) Field of Classification Search
CPC ............ H01B 3/16; H01B 3/56; H01B 9/06; H01B 17/00; H01B 3/00; H01H 33/22; H01H 2033/56; H01H 2033/567; H01H 2033/568; H01H 33/57; H01H 33/66; H01H 33/565; H01H 2033/566; H01H 33/32; H01H 33/91; H01H 33/95; H01H 33/56; B65B 31/00

USPC ........... 252/571; 174/8, 13 R, 137 B; 218/13
See application file for complete search history.

(56) References Cited

U.S. PATENT DOCUMENTS 4,288,651 A * 9/1981 Wootton ................. H01B 3/16
174/17 GF
6,683,267 B1* 1/2004 Piazza et al. ...................... 218/2
(Continued)

FOREIGN PATENT DOCUMENTS

CN 1898353 A 1/2007
CN 1973016 A 5/2007
(Continued)

OTHER PUBLICATIONS

Combined Chinese Office Action and Search Report issued Aug. 5, 2015 in Patent Application No. 201280043105.4 (with English Translation).

(Continued)

*Primary Examiner* — Jenny L Wagner
*Assistant Examiner* — Pete Lee
(74) *Attorney, Agent, or Firm* — Oblon, McClelland, Maier & Neustadt, L.L.P.

(57) ABSTRACT

The invention relates to the use of a mixture comprising a hydrofluoroolefin, possibly associated with a dilution gas, as a gaseous electrical insulation and/or electrical arc extinguishing medium in substation medium-voltage electrical device.
It also relates to medium-voltage electrical device in which electrical insulation and/or electrical arc extinguishing is (are) performed by a gaseous medium comprising hydrofluoroolefin, possibly associated with a dilution gas.

13 Claims, 2 Drawing Sheets

(51) Int. Cl.
*H01H 33/56* (2006.01)
*B65B 31/00* (2006.01)

(56) References Cited

U.S. PATENT DOCUMENTS

| | | | |
|---|---|---|---|
| 7,807,074 B2* | 10/2010 | Luly et al. | 252/571 |
| 2004/0089839 A1 | 5/2004 | Thomas et al. | |
| 2005/0241805 A1 | 11/2005 | Singh et al. | |
| 2007/0100173 A1 | 5/2007 | Miller et al. | |
| 2008/0135817 A1 | 6/2008 | Luly et al. | |
| 2010/0123095 A1* | 5/2010 | Minor | C08J 9/149 252/68 |
| 2010/0127209 A1 | 5/2010 | Singh et al. | |
| 2010/0174123 A1* | 7/2010 | Sievert | C07C 17/25 570/136 |
| 2010/0320428 A1 | 12/2010 | Luly et al. | |
| 2011/0289748 A1 | 12/2011 | Singh et al. | |
| 2014/0209830 A1 | 7/2014 | Shimomura et al. | |

FOREIGN PATENT DOCUMENTS

| | | |
|---|---|---|
| CN | 101300216 A | 11/2008 |
| CN | 101827921 A | 9/2010 |
| WO | 2005 108523 | 11/2005 |

OTHER PUBLICATIONS

International Search Report Issued Oct. 9, 2012 in PCT/EP12/063180 Filed Jul. 5, 2012.

U.S. Appl. No. 14/346,597, filed Mar. 21, 2014, Kieffel, et al.

* cited by examiner

USE OF A MIXTURE COMPRISING A HYDROFLUOROOLEFIN AS A MEDIUM-VOLTAGE ARC-EXTINGUISHING AND/OR INSULATING GAS AND MEDIUM-VOLTAGE ELECTRICAL DEVICE COMPRISING SAME

TECHNICAL FIELD

The present invention relates to the field of electrical insulation and extinguishing of electrical arcs in medium-voltage devices.

More precisely, it relates to the use of mixtures that comprise a particular alkene, namely a hydrofluoroolefin with three carbon atoms, as an insulation and/or arc extinguishing gas in substation electrical devices and particularly in medium-voltage devices. The hydrofluoroolefin may be used mixed with another hydrofluoroolefin or with a dilution gas that has a lower global warming potential than its own, and particularly less than or equal to one.

It also relates to substation medium-voltage electrical devices in which the electrical insulation and/or electrical arc extinguishing are done by a gaseous medium comprising at least one hydrofluoroolefin, this compound having the highest global gas warming potential of the gases present in the gaseous medium.

Such an electrical device may be particularly an electrical transformer such as a power supply or measurement transformer, a gas-insulated line for transporting or distributing electricity, a set of busbars or an electrical connection/disconnection device (also called a switchgear) such as a circuit breaker, a switch, a unit combining a switch with fuses, a disconnector, an earthing switch or a contactor.

STATE OF THE PRIOR ART

In the foregoing and what follows, the terms "medium-voltage" (MV) and "high-voltage" (HV) are used in their habitual acceptance, namely the term "medium-voltage" means a voltage that is greater than 1 000 volts for alternating current and 1 500 volts for direct current, but that does not exceed 52 000 volts for alternating current and 75 000 volts for direct current, while the term "high-voltage" refers to a voltage that is strictly greater than 52 000 volts for alternating current and 75 000 volts for direct current.

Electrical insulation and possibly extinguishing of electric arcs in medium- or high-voltage electrical devices are typically done by a gas confined inside a enclosure in the devices. At the present time, the most frequently used gas is sulphur hexafluoride ($SF_6$): this gas has a relatively high dielectric strength, a good thermal conductivity and low dielectric losses. It is chemically inert and non-toxic for man and animals and, after being dissociated by an electric arc, it recombines quickly and almost entirely. It is also uninflammable and its price is still moderate.

However, $SF_6$ has the major disadvantage that it has a global warming potential (GWP) of 22 800 (relative to $CO_2$ over 100 years) and a residence time in the atmosphere of 3 200 years, which places it among gases having a strong global greenhouse effect. Therefore, $SF_6$ was included in the Kyoto Protocol (1997) on the list of gases for which emissions must be limited.

The best way to limit $SF_6$ emissions is to limit the use of this gas, which has led manufacturers to look for alternatives to $SF_6$. In fact, the other solutions such as hybrid systems combining a gas insulation with a solid insulation (EP-A-1 724 802) increase the volume of the electrical devices relative to the volume that is possible with an $SF_6$ insulation; the cut off in oil or in a vacuum makes it necessary to redesign the devices.

Dielectric gases are known: see for example WO-A-2008/073790. However, so-called "simple" gases like air or nitrogen, that have no negative impact on the environment, have a much lower dielectric strength than $SF_6$; their use for electrical insulation and/or extinguishing electrical arcs in HV/MV devices would require drastically increasing the volume and/or the filling pressure of these devices, which goes against efforts that have been made over the past few decades to develop compact and less bulky electrical devices.

Perfluorocarbons ($C_nF_{2n+2}$, c-$C_4F_8$) in general have attractive dielectric strength properties, but their GWP is typically within a range from 5 000 to 10 000. Other alternatives such as trifluoroiodomethane ($CF_3I$) that have promising electrical characteristics and GWP are classified among carcinogenic, mutagenic and reprotoxic substances of category 3, which makes them unacceptable for use on an industrial scale.

Mixtures of $SF_6$ and other gases such as nitrogen or nitrogen dioxide are used to limit the impact of $SF_6$ on the environment; see for example WO-A-2009/049144. Nevertheless, due to the high GWP of $SF_6$, the GWP of these mixtures remains very high. Thus for example, a mixture of $SF_6$ and nitrogen with a ratio by volume of 10:90 has a dielectric strength in alternating current (50 Hz) equal to 59% of that of $SF_6$ but its GWP is of the order of 8 000 to 8 650. Therefore such mixtures cannot be used as a gas with a low environmental impact.

Thus, only mixtures with a high GWP have a dielectric strength similar to $SF_6$ at low temperature; all mixtures with low GWP known in the prior art can be used to reach not more than 80% of the performances of $SF_6$ devices for the lowest service temperatures but, in particular, by increasing the gas pressure, by adding dielectric deflectors, and by coating some parts with insulating layers, which requires a new design of the MV or HV devices taking account of longer insulation distances and possibly adding special devices such as screens, deflectors or cladding.

The inventors set themselves the purpose of finding a gas which, while having good properties of electrical insulation and electrical arc extinguishing, has a low or zero impact on the environment. Research led them to envisage a new family of gases that can be used in currently marketed medium- or high-voltage electrical devices to replace the $SF_6$ with which such devices are generally filled, throughout their complete service temperature range and particularly at very low temperatures.

PRESENTATION OF THE INVENTION

The invention achieved these and other purposes firstly by providing the use of a mixture comprising at least one hydrofluoroolefin as a gaseous medium for electrical insulation and/or electrical arc extinguishing in a medium-voltage device.

The hydrofluoroolefins used are alkenes with a carbon chain having three carbon elements, preferably of the $C_3H_2F_4$ type, that are not toxic, not corrosive, not explosive, have an ODP (Ozone Depletion Potential) equal to 0, a GWP less than 20 or even less than 10, and have dielectric properties making them suitable to replace $SF_6$ as an insulation and/or arc extinguishing gas in substation medium-voltage electrical devices.

According to the invention, the mixture is such that its components are kept in the gas state under temperature and pressure conditions to which it will be submitted once it is confined in the electrical device. The hydrofluoroolefin can be used mixed with at least one other hydrofluoroolefin of the same form. However, the hydrofluoroolefins will be most frequently used as a mixture with at least one other gas that does not belong to their family, particularly if the boiling point of this (these) hydrofluoroolefin(s) makes it impossible to guarantee that it remains (they remain) in the gas state.

In this case, according to the invention, the other gases used in the mixture have a lower global warming potential than hydrofluoroolefins; the vector gas, or dilution gas, or buffer gas, preferably has a very low boiling point, that is to say typically less than or equal to −50° C. at the standard pressure, and a dielectric strength that is at least equal to the dielectric strength of nitrogen or carbon dioxide. Preferably, the hydrofluoroolefin is mixed with a gas such as nitrogen, air (preferably dry), oxygen, carbon dioxide or a mixture of these gases. The global GWP of the gaseous medium is relative to the partial pressures of each of its components and therefore less than 10 or 20, and preferably less than 5.

According to the invention, the hydrofluoroolefin is present in the mixture at a molar percentage $M_{HFO}$ which is at least equal to 95% of the molar percentage M (in other words, at least equal to 0.95 time this molar percentage M) determined by the formula $M=(P_{HFO}/P_{mixture}) \times 100$, in which $P_{mixture}$ is the pressure of the mixture in the electrical device at 20° C. and $P_{HFO}$ is the pressure, expressed in the same units, that at 20° C. is equivalent to the saturated vapour pressure of the hydrofluoroolefin at the minimum service temperature of the electrical device. In fact, $P_{HFO}$ is determined by $P_{HFO}=(PVS_{HFO} \times 293)/T_{min}$, where $PVS_{HFO}$ is representative of the saturated vapour pressure of the hydrofluoroolefin at the minimum temperature $T_{min}$, expressed in kelvins, at which the electrical device is used. Thus, the dielectric properties of the mixture are as high as possible and are almost equal to those of $SF_6$. In the preferred embodiments, the minimum service temperature $T_{min}$ is chosen from 0, −5, −10, −15, −20, −25, −30, −35, −40, −45 and −50° C.

The partial presence of the medium in the liquid state will not cause any normative problems in the case in which the electrical device is a medium-voltage device. Therefore, a mixture can be used in which the hydrofluoroolefin is present in a molar percentage $M_{HFO}$ higher than the molar percentage M. Preferably, the molar percentage of the hydrofluoroolefin $M_{HFO}$ is between 95% and 130%, better still between 95% and 120%, and ideally between 99% and 110% of the molar percentage M. In other words, the hydrofluoroolefin is preferably present in the mixture in a molar percentage between 0.95 time and 1.3 time, and even better between 0.95 and 1.2 time, and ideally between 0.99 and 1.1 time the molar percentage M.

In the case in which the electrical device is a medium- or high-voltage metal-clad substation type of device, it is desirable that the mixture should be exclusively or quasi-exclusively in the gas state throughout the service temperature range of this device, so that it can satisfy IEC standards currently in force. Therefore, it is preferred that the hydrofluoroolefin should be present in a molar percentage $M_{HFO}$ that does not exceed 100% of the molar percentage M (in other words, that does not exceed one time this molar percentage M) so that it will not have a liquefaction phase. Preferably, the molar percentage of the hydrofluoroolefin $M_{HFO}$ is between 98% and 100% of the molar percentage M (in other words, between 0.98 time and 1 time this molar percentage M).

Another purpose of the invention is a medium-voltage electrical device that comprises a sealed enclosure in which electrical components are located together with a gaseous medium providing the electrical insulation and/or electric arc extinguishing within this enclosure, this gaseous medium being composed of a mixture comprising at least one hydrofluoroolefin. The mixture characteristics are as disclosed above for its use.

In accordance with the invention, this electrical device may be a gas-insulated electrical transformer such as, for example, a power supply transformer or a measurement transformer. The electrical device may also be a gas-insulated line, above ground or below ground, or a set of busbars for transporting or distributing electricity. Finally, it may also be electrical connection/disconnection device (also called a switchgear) such as, for example, a circuit breaker, a switch, a disconnector, an unit combining a switch with fuses, an earthing switch or a contactor.

BRIEF DESCRIPTION OF THE DRAWINGS

Other advantages and characteristics will become clearer from the following description of particular embodiments of the invention given for illustration and in no way limitative, represented in the appended figures.

DETAILED PRESENTATION OF PARTICULAR EMBODIMENTS

Figure 1:
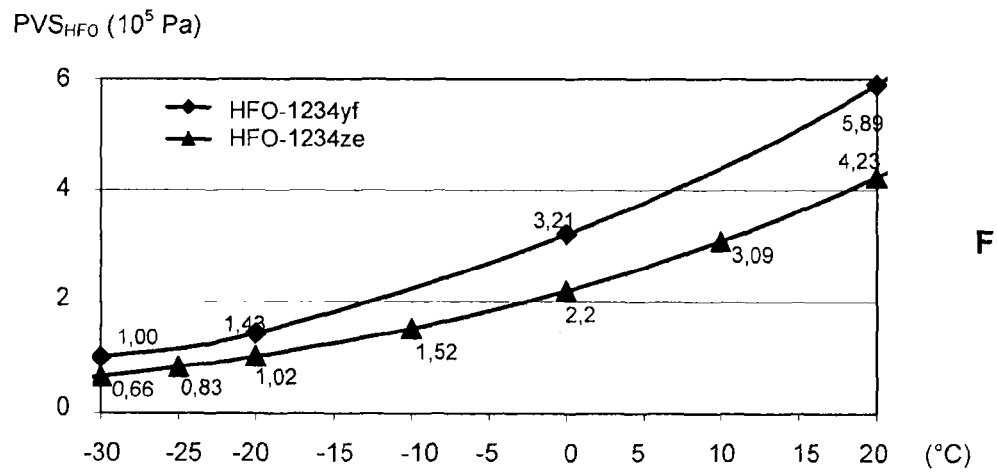
FIG. 1 shows the saturated vapour pressure of two HFOs as a function of the temperature.

The invention is based on the use of hydrofluoroolefins (HFO) with at least 3 carbon atoms, with or without a dilution gas ("buffer" gas such as $N_2$, $CO_2$, air, etc.); HFOs are alkenes substituted by fluorine with the general formula $C_n(H,F)_{2n}$. In particular, the HFOs used comprise 3 carbon atoms; they are uninflammable and their GWP is less than 10.

In particular, hydrofluoroolefin HFO-1234ze, or trans-1,3,3,3-tetrafluoro-1-propene, that satisfies formula $CHF=CH-CF_3$, is used for the following comparative examples. Its environmental impact is GWP=6, and it is not toxic for man with an occupational exposure limit (the average limit concentration to which most workers might be regularly exposed when working for 8 hours per day for 5 days per week, without being affected by any noxious effect) OEL=1 000 ppm, and a lethal dose DL50 causing death of 50% of an animal population equal to more than 200 000 ppm. Yet, in most conventional very low temperature applications (−30° C., or even −40° C.), HFO is diluted, sometimes to less than 20%, in a neutral vector gas like nitrogen; therefore the mixture is not toxic.

According to one preferred embodiment of the invention, the HFO is used in gaseous form regardless of the service temperature of the electrical device. Therefore, its partial pressure should be less than or equal to its saturated vapour pressure (SVP) at the lowest temperature. However, since the devices are usually filled in at ambient temperature, an equivalent pressure $P_{HFO}$, is used, for example at 20° C., to obtain a result conforming with the recommendations according to the invention. Table I thus gives the pressure values of HFO-1234ze as a function of the temperature (see also FIG. 1).

TABLE I

Saturated vapour pressures of HFO-1234ze.

| Temperature (° C.) | Estimated SVP (kPa) | $P_{HFO}$ at 20° C. (kPa) |
|---|---|---|
| 0° C. | 220 | 236 |
| −10° C. | 150 | 167 |
| −20° C. | 100 | 116 |
| −25° C. | 83 | 98 |
| −30° C. | 66 | 80 |
| −40° C. | 41 | 52 |

The recommended internal pressure in the insulation and/or arc extinguishing medium varies depending on the device. Since the HFO according to the invention is entirely or almost entirely in gas form at the lowest temperature of the electrical device, a dilution gas, or buffer gas, is added to satisfy the given filling pressure conditions. In particular, if it is envisaged to use at −20° C. a device of the type that has to be filled up to 5 bars (i.e. 500 kPa), HFO-1234ze at 1.16 bar (i.e. 116 kPa) is mixed with a buffer gas at 3.84 bars (i.e. 384 kPa) at ambient temperature.

Preferably, the dilution gas has a very low boiling point, less than or equal to the minimum service temperature $T_{min}$ of the device and a dielectric strength greater than or equal to that of $CO_2$ or air under identical test conditions (same device, same geometric configuration, same operating parameters, etc.) as those used to measure the dielectric strength of said gas. Furthermore, according to the invention, the dilution gas used is a gas with a low GWP like air or $CO_2$: thus, the GWP of the gaseous medium used as insulation and arc extinguisher in electrical devices is less than or equal to the GWP of the reference HFO. Preferably, a dilution gas with zero GWP, nitrogen $N_2$, is used.

Therefore, in order to determine the composition of the mixture for the filling, the filling pressure of the electrical device $P_{mixture}$ is determined. The equivalent molar percentage M in HFO is given by the formula $M=(P_{HFO}/P_{mixture})\times 100$, where $P_{HFO}$ is the pressure equivalent, at the temperature concerned (that is to say, usually the filling temperature, corresponding to the filling pressure), to the saturated vapour pressure SVP of HFO at the minimum service temperature $T_{min}$ of the device ($P_{HFO}=(PVS_{HFO}\times 293)/T_{min}$). This percentage M represents the maximum quantity of HFO so that there is no liquid in the enclosure. In some cases, it is essential that this threshold M should not be exceeded to prevent any presence of liquid; for example, at medium-voltage, it is sometimes possible to have a little liquid at low or very low temperature, and the molar filling percentage $M_{HFO}$ can reach 110% or even 130% of M. Furthermore, since the HFO has a better dielectric strength than vector gases, it is desirable to optimise the filling by the HFO: therefore, $M_{HFO}$ is chosen to be greater than or equal to 95% of the molar percentage M, and preferably $M_{HFO} \geq 0.98 \cdot M$, or $M_{HFO}=0.99 \cdot M$.

Figure 2:
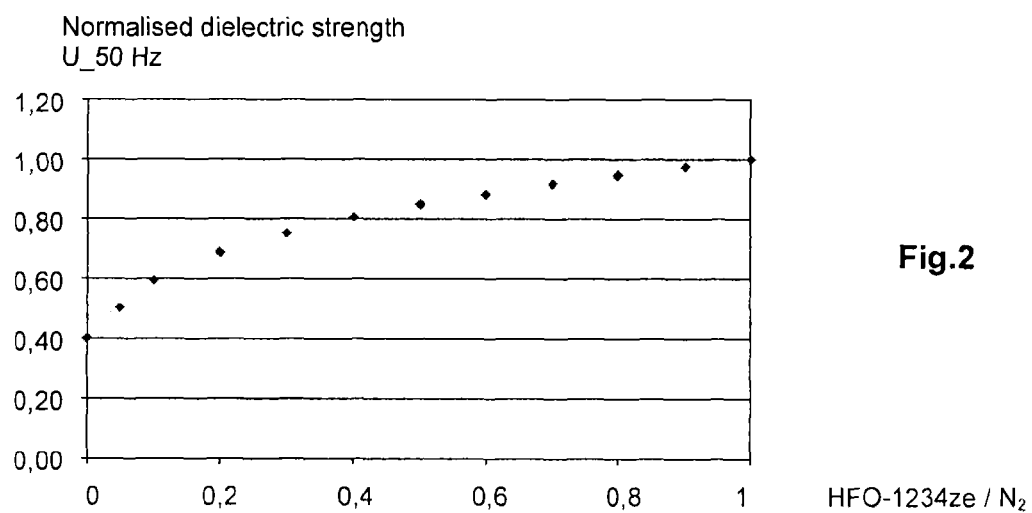
FIG. 2 is a curve showing the variation of the normalised dielectric strength of a mixture of HFO-1234ze and $N_2$ as a function of the molar percentage of HFO in this mixture.

In fact, the dielectric strength of the pure HFO is similar to that of pure $SF_6$, better than that of dilution gases. As shown in FIG. 2, the measurement of HFO-1234ze alone or mixed with nitrogen, on a GIS 145 kV type device in 50 Hz alternating voltage shows that the mixture according to the invention satisfies the use conditions for existing devices.

Figure 3:
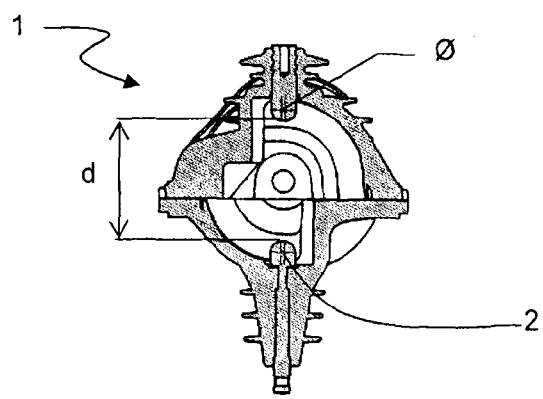
FIG. 3 shows a device in which the dielectric strength tests were done with a mixture according to the invention.

In particular, the dielectric strength of the HFO, alone or mixed with a "neutral" dilution gas, has been found to satisfy the required conditions. In particular:

on a direct line, the tests under a lightning surge (1.2-50 μs wave) from phase to earth were made inside an epoxy enclosure 1 (Fluokit M24+ type, i.e. of the <<air insulated switchgear>>) between two contacts 2 with a radius of 12 mm made of silver-plated copper at a distance d=134 mm shown in FIG. 3, at ambient temperature. The results are given in table II: in one non-uniform electric field configuration, the dielectric strength of HFO-1234ze is equivalent to that of the $SF_6$.

in tracking, tests under a lightning surge (1.2-50 μs wave) were carried out inside the same enclosure shown in FIG. 3, in which the contact separation distance is d=317 mm, at ambient temperature. The average electrical field (Upeak/317 mm) that caused initiation between the contacts 2 by tracking is 814 V/mm, a value that is only 10% less than the value measured under the same conditions with device full of $SF_6$ at the same pressure.

Similarly, in a non-uniform electrical field configuration like that shown in table III, HFO-1234ze has a partial discharge resistance equivalent to that of $SF_6$; tests on comparative resistance to partial discharges (Corona effect) were carried out in the same chamber as the dielectric strength tests on a direct line (FIG. 3, d=134 mm).

TABLE II dielectric strength of HFO-1234ze alone or mixed

| Gas | Absolute pressure | Strength for positive polarity | Strength for negative polarity |
|---|---|---|---|
| $SF_6$ | 300 kPa | 190 kV | 185 kV |
| HFO-1234ze | 300 kPa | 183 kV | 208 kV |
| Difference/$SF_6$ | | −3.6% | +12.4% |
| $N_2$ | 130 kPa | 118 kV | 113 kV |
| HFO-1234ze + $N_2$ | 30 kPa + 100 kPa | 254 kV | 285 kV |
| Difference/$N_2$ | (severe cold mixture −45° C.) | +215% | +252% |

TABLE III resistance to partial discharges of HFO-1234ze alone or mixed

| Gas | Absolute pressure | Extinguishing threshold |
|---|---|---|
| $SF_6$ | 200 kPa | 20 kV |
| HFO-1234ze | 200 kPa | 26 kV |
| Difference/$SF_6$ | | +6 kV |
| $SF_6$ | 120 kPa | 65 kV |
| HFO-1234ze + $N_2$ | 20 kPa + 100 kPa | 57 kV |
| Difference/$SF_6$ | (severe cold mixture −50° C.) | −8 kV |

A comparative resistance to temperature rise test, carried out on an AIS type device measures, at the electrical contacts (hottest points), the maximum temperature rises on the switchgear through which a permanent current of 630 A RMS passes. As shown in table IV, the temperature rises measured on an average of three measurement points with HFO-1234ze are of the same order as those measured with $SF_6$.

TABLE IV resistance to temperature rise of the HFO alone or mixed

| Gas (in absolute pressure) | Contact temperature rise absolute temperature | relative to $SF_6$ |
|---|---|---|
| $SF_6$ (138 kPa) | 50.63 K | / |
| $N_2$ (138 kPa) | 53.6 K | +5.8% |
| HFO-1234ze (138 kPa) | 50.13 K | −1% |
| HFO-1234ze (98 kPa) + $N_2$ (40 kPa) (severe cold mixture −25° C.) | 50.8 K | +0.3% |

For example, hydrofluoroolefin HFO-1234ze with a little nitrogen will be used in severe cold devices ($T_{min} \leq -40°$ C.), the quantity of additive being clearly determined as a function of the minimum service temperature of the electrical device.

More generally, since the content of HFO-1234ze is related to its saturated vapour pressure, the dielectric strength of the different HFO-1234ze/$N_2$ mixtures (with different HFO contents) at 50 Hz (U_50 Hz) can be determined for different minimum temperatures from −30° C. to 0° C.: see table V that also gives a comparison with $SF_6$ properties in order to verify that use conditions are satisfied. For example, for a device that will be used at a minimum temperature of −30° C. where the saturated vapour pressure of HFO-1234ze is 66 kPa, which represents a pressure of 80 kPa measured at 20° C., and if the total pressure of the gas mixture in this type of device is 5 bars absolute (namely 500·kPa), the molar ratio will then be 0.8/5, i.e. 16% of HFO in nitrogen. The GWP of the mixture is of the order of 2: a mixture of HFO-1234ze at a molar ratio of 16% and a GWP=6 with nitrogen strongly reduces the environmental impact.

TABLE V characteristics of a HFO-1234ze/$N_2$ mixture

| Temperature (° C.) | SVP HFO-1234ze (kPa abs) | Total pressure (kPa) | Ratio HFO-1234ze (%) | U_50 Hz (kV rms) | % $SF_6$ |
|---|---|---|---|---|---|
| −30 | 66 | 500 | 15.9 | 296 | 65 |
| −25 | 83 | 500 | 19.6 | 312 | 69 |
| −20 | 102 | 500 | 23.6 | 327 | 72 |
| −10 | 152 | 500 | 33.9 | 354 | 78 |
| 0 | 220 | 500 | 47.2 | 379 | 84 |

The performances of the HFO alone or mixed with a simple air or nitrogen type dilution gas justify that an use in an existing device can be envisaged. In particular, after creating a vacuum using an oil vacuum pump, a 5 bars marketed device may be filled for an use at −30° C. by means of a gas mixer to control the ratio between HFO-1234ze and the vector gas $N_2$, this ratio being kept constant and equal to 16% of the pressure throughout filling due to the use of a precision mass flow meter; preferably, the vacuum (0 to 0.1 kPa) has already been created in the device.

For example, it may be a 145 kV GIS type device with a rated voltage and with a structure exactly the same as the device marketed by Alstom Grid under reference B65 and currently filled with $SF_6$. The device thus filled with the disclosed mixture is then subjected to dielectric strength tests at ambient temperature under lightning surges (1.2-50 μs wave) with positive wave and negative wave in accordance with standard IEC 62271-1, as described above. The dielectric strength at power frequency reaches a value of 296 kV rms, which represents 65% of the dielectric strength of this device under $SF_6$ at the same pressure and at least 68% more than the dielectric strength of the same device filled with dry air or nitrogen at the same pressure. Therefore the performances are quite acceptable and much better than the performances obtained for other insulation gases with low GWP.

At the same time, it could be a medium-voltage device such as Fluokit M24+ marketed by Schneider Electric: this AIS type switch-disconnector can be filled with a mixture of HFO-1234ze (98 kPa absolute) and $N_2$ (40 kPa absolute), and breaking tests can be carried out under the conditions defined in standard IEC 60265-1 cycle TD1, to estimate the performances of HFO-1234ze in breaking by comparing them with the performances of $SF_6$. The switchgear has thus cut off 630 A/12 kV with arc times similar to those measured with $SF_6$; progressively increasing the voltage and current until failure to break demonstrates preliminary limits (without any precaution and/or adaptation as a result of this new mixture) of the device at 811 A/16 kV, a priori slightly better than values obtained with $SF_6$.

Note also that, since existing devices are already provided with anhydrous calcium sulphate ($CaSO_4$) type molecular sieves that absorb the small molecules created during the break, the toxicity of the gas is not increased after partial discharges by molecules that may have some toxicity.

Furthermore, at the end-of-life or after break tests, the gas is recovered using conventional recovery techniques using a compressor and a vacuum pump. Hydrofluoroolefin HFO-1234ze is then separated from the buffer gas using a zeolite capable of trapping only the buffer gas, smaller in size; alternatively, a selective separation membrane can allow nitrogen to escape and retains HFO-1234ze that has a higher molar mass; all other options could be considered.

The influence of the molar percentage of the hydrofluoroolefin in the mixture on the dielectric strength of this mixture has been verified by complementary dielectric strength tests in uniform field that have been carried out at ambient temperature on a series of Fluokit M24+ type medium-voltage devices.

These devices were filled either with HFO-1234ze/nitrogen mixtures in which the molar percentage of HFO-1234ze was different for different devices, so that it is equal to 53%, 81%, 100% and 120% of the molar percentage M of HFO-1234ze respectively, to guarantee that the proportion of HFO-1234ze that is in the gas state is maximum at −25° C., or with pure HFO-1234.

The results of these tests are given in table VI below, in which the dielectric strength obtained with a mixture of HFO-1234ze/nitrogen or with pure HFO-1234 is expressed in the form of a percentage of the dielectric strength obtained at the same temperature and for the same type of device when it is filled with $SF_6$ at the same total pressure.

TABLE VI

Influence of the molar percentage of HFO-1234ze on the dielectric strength

| Total pressure at 20° C. (kPa) | Pressure of HFO-1234ze at 20° C. (kPa) | Molar percentage of HFO-1234ze | Dielectric strength (in % of that obtained with $SF_6$) |
|---|---|---|---|
| 130 | 51.6 | 39.7 (i.e. 53% of M) | 57 |
| 130 | 79.6 | 61.2 (i.e. 81% of M) | 68 |

TABLE VI-continued

Influence of the molar percentage of
HFO-1234ze on the dielectric strength

| Total pressure at 20° C. (kPa) | Pressure of HFO-1234ze at 20° C. (kPa) | Molar percentage of HFO-1234ze | Dielectric strength (in % of that obtained with $SF_6$) |
|---|---|---|---|
| 130 | 98.1 | 75.5 (i.e. 100% of M) | 79 |
| 130 | 118.1 | 90.8 (i.e. 120% of M) | 89 |
| 130 | 130 | 100 (i.e. 133% of M) | 98 |
| 142 | 142 | 100 (i.e. 146% of M) | 106 |

Figure 4:
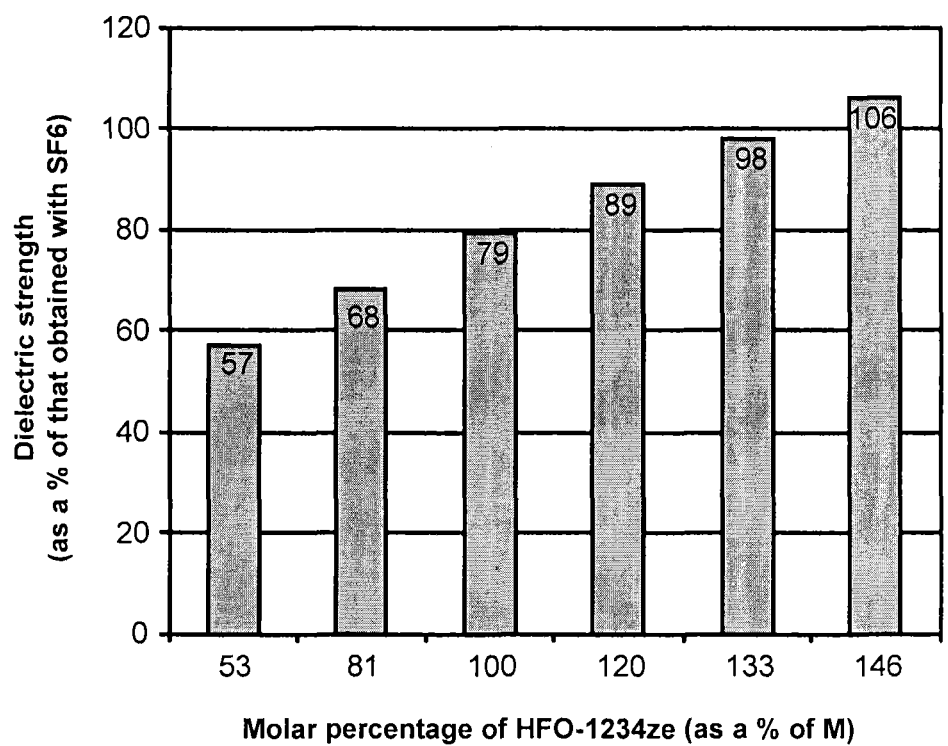
FIG. 4 shows the variation of the dielectric strength of a mixture of HFO-1234ze and $N_2$ as a function of the molar percentage of HFO-1234ze in this mixture, in the form of a bar chart.

The results of these tests are also shown in FIG. 4 in the form of a bar chart, showing:
- on the abscissa, the molar percentage of HFO-1234ze, expressed as a percentage of the molar percentage M; and
- on the ordinate, the dielectric strength obtained expressed as a percentage of the strength obtained with $SF_6$.

Table VI and FIG. 4 clearly show that as soon as a hydrofluoroolefin like HFO-1234ze is used mixed with a vector gas such as nitrogen, it is desirable that this hydrofluoroolefin should be present in this mixture with a molar percentage equal to at least 95% of the molar percentage M if it is required to achieve dielectric strength performances similar to $SF_6$ or to exceed these performances.

Although the examples given above were made with HFO-1234ze, there are alternatives to this gas. In particular, isomer HFO-1234yf or 2,3,3,3-tetrafluoro-1-propene that satisfies formula $CH_2=CF-CH_3$ can be used, with adaptations inherent to the properties of this gas: in particular as shown in FIG. 1, since the boiling point is −30° C. (compared with −19° C. for HFO-1234ze), it is possible to use 50% more HFO-1234yf than HFO-1234ze, for the same operating temperature of −30° C. The dielectric strength is increased because for a given filling pressure, increasing the quantity of HFO reduces the quantity of buffer gas, and the insulation and arc extinguishing properties depend on the mixture.

The solution according to the invention thus discloses a gas or a gas mixture with a low environmental impact (GWP more than 99.9% less than $SF_6$ insulation) compatible with minimum service temperatures of the electrical device and with dielectric, break and thermal dissipation properties similar to what are obtained on existing devices. This gas, alone or mixed, can replace $SF_6$ used in the devices without modifying or only slightly modifying their design; production lines can be kept, all that has to be done is to simply replace the filling gas.

REFERENCES CITED

EP-A-1 724 802
WO-A-2008/073790
WO-A-2009/049144

The invention claimed is:

1. A process for electrically insulating and/or electrical arc extinguishing an electrical device having a sealed enclosure for containing electrical components in a gaseous medium under pressure, the process comprising:
   selecting a minimum service temperature ($T_{min}$) of the electrical device;
   selecting a hydrofluoroolefin with three carbon atoms and a dilution gas to be provided as a mixture in said enclosure such that said mixture having a global warming potential (GWP) lower than the global warming potential of the hydrofluoroolefin; and
   providing said mixture in the sealed enclosure such that the hydrofluoroolefin is present in the mixture at a molar percentage ($M_{HFO}$) at least equal to 95% of the molar percentage M determined by the formula $M=(P_{HFO}/P_{mixture})\times 100$, in which $P_{mixture}$ is a pressure of the mixture at 20° C. in the electrical device and $P_{HFO}$ is a pressure that at 20° C. is equivalent to the saturated vapour pressure (SVP) of the hydrofluoroolefin at said selected minimum service temperature ($T_{min}$) of the electrical device.

2. The process of claim 1, wherein the hydrofluoroolefin is trans-1,3,3,3-tetrafluoro-1-propene (HFO-1234ze).

3. The process of claim 1, wherein the hydrofluoroolefin is 2,3,3,3-tetrafluoro-1-propene (HFO-1234yf).

4. The process of claim 1, wherein the dilution gas is selected from the group consisting of air, nitrogen, oxygen, carbon dioxide, and a mixture of these gases.

5. The process of claim 1, wherein the hydrofluoroolefin molar percentage ($M_{HFO}$) is between 99% and 110% of the molar percentage M.

6. The process of claim 1, wherein the selecting a minimum temperature ($T_{min}$) comprises selecting a temperature which ranges from −50° C. to 0° C.

7. The process of claim 1, wherein the electrical device is a substation medium voltage electrical device.

8. The process of claim 1, wherein the minimum service temperature ($T_{min}$) is selected from the group consisting of −50° C., −45° C., −40° C., −30° C., −25° C., −15° C., −10° C., −5° C., and 0° C.

9. A medium-voltage electrical device having a minimum service temperature ($T_{min}$), comprising:
   a sealed enclosure in which electrical components are located together with a gaseous medium, under pressure, for providing electrical insulation and/or electric arc extinguishing within this enclosure,
   wherein the gaseous medium is a mixture of a hydrofluoroolefin with three carbon atoms and a dilution gas such that the mixture has a global warming potential (GWP) lower than the global warming potential of the hydrofluoroolefin, and
   a molar percentage ($M_{HFO}$) of the hydrofluoroolefin in the mixture is at least equal to 95% of a molar percentage M determined by the formula: $M=(P_{HFO}/P_{mixture})\times 100$, in which $P_{mixture}$ is a pressure of the mixture at 20° C. in the electrical device and $P_{HFO}$ is a pressure that at 20° C. is equivalent to the saturated vapour pressure (SVP) of the hydrofluoroolefin at the minimum service temperature ($T_{min}$) of the electrical device.

10. The device according to claim 9, wherein the hydrofluoroolefin is trans-1,3,3,3-tetrafluoro-1-propene (HFO-1234ze) or 2,3,3,3-tetrafluoro-1-propene (HFO-1234yf).

11. The device according to claim 9, wherein the dilution gas is selected from the group consisting of air, nitrogen, oxygen, carbon dioxide, and a mixture of these gases.

12. The device according to claim 9, wherein the hydrofluoroolefin molar percentage ($M_{HFO}$) is between 99% and 110% of the molar percentage M.

13. The device of claim 9, which is a gas-insulated electrical transformer, a gas-insulated line for transporting or distributing electricity or an electrical connection/disconnection device.

* * * * *